(12) United States Patent
Forrest et al.

(10) Patent No.: US 9,099,652 B2
(45) Date of Patent: Aug. 4, 2015

(54) ORGANIC ELECTRONIC DEVICES WITH MULTIPLE SOLUTION-PROCESSED LAYERS

(71) Applicant: THE REGENTS OF THE UNIVERSITY OF MICHIGAN, Ann Arbor, MI (US)

(72) Inventors: Stephen R. Forrest, Ann Arbor, MI (US); Brian E. Lassiter, Ypsilanti, MI (US); Jeramy D. Zimmerman, Golden, CO (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/473,995

(22) Filed: Aug. 29, 2014

(65) Prior Publication Data
US 2015/0064837 A1      Mar. 5, 2015

Related U.S. Application Data

(60) Provisional application No. 61/871,535, filed on Aug. 29, 2013.

(51) Int. Cl.
*H01L 51/52* (2006.01)
*H01L 51/00* (2006.01)
*H01L 27/30* (2006.01)

(52) U.S. Cl.
CPC .......... *H01L 51/0028* (2013.01); *H01L 27/307* (2013.01); *H01L 51/0008* (2013.01)

(58) Field of Classification Search
CPC . H01L 27/3209–27/3213; H01L 51/46–51/54; H01L 51/524–51/529; H01L 51/5012; H01L 51/5016; H01L 51/5036; H01L 51/4253

USPC ............ 257/40, 59, 79–98, E33.056, 51.018, 257/26, 44

See application file for complete search history.

(56) References Cited

U.S. PATENT DOCUMENTS 5,703,436 A * 12/1997 Forrest et al. ................. 313/506
6,310,360 B1 * 10/2001 Forrest et al. .................. 257/40
(Continued)

FOREIGN PATENT DOCUMENTS

KR      10-2011-0065483 A      6/2011

OTHER PUBLICATIONS

ISR/Written Opinion issued Nov. 28, 2104, in counterpart PCT application No. PCT/US2014/053597.
(Continued)

*Primary Examiner* — Michael Lebentritt
(74) *Attorney, Agent, or Firm* — Duane Morris LLP

(57) ABSTRACT

A method of fabricating a tandem organic photosensitive device involves depositing a first layer of an organic electron donor type material film by solution-processing of the organic electron donor type material dissolved in a first solvent; depositing a first layer of an organic electron acceptor type material over the first layer of the organic electron donor type material film by a dry deposition process; depositing a conductive layer over the interim stack by a dry deposition process; depositing a second layer of the organic electron donor type material over the conductive layer by solution-processing of the organic electron donor type material dissolved in a second solvent, wherein the organic electron acceptor type material and the conductive layer are insoluble in the second solvent; depositing a second layer of an organic electron acceptor type material over the second layer of the organic electron donor type material film by a dry deposition process, resulting in a stack.

27 Claims, 8 Drawing Sheets

(56) References Cited

U.S. PATENT DOCUMENTS

| | | |
|---|---|---|
| 7,285,432 B2 | 10/2007 | Kwong et al. |
| 8,288,187 B2 | 10/2012 | Cheon et al. |
| 2001/0000005 A1* | 3/2001 | Forrest et al. ............ 204/192.12 |
| 2004/0031965 A1* | 2/2004 | Forrest et al. .................... 257/79 |
| 2004/0262614 A1* | 12/2004 | Hack et al. ....................... 257/79 |
| 2005/0110005 A1* | 5/2005 | Forrest et al. .................... 257/40 |
| 2006/0273714 A1* | 12/2006 | Forrest et al. .................. 313/504 |
| 2006/0279204 A1* | 12/2006 | Forrest et al. .................. 313/506 |
| 2007/0116983 A1* | 5/2007 | Kanno et al. ................... 428/690 |
| 2007/0278937 A1* | 12/2007 | Forrest et al. .................. 313/504 |
| 2008/0067530 A1* | 3/2008 | Forrest et al. .................... 257/98 |
| 2008/0102310 A1* | 5/2008 | Thompson et al. ........... 428/690 |
| 2008/0265757 A1* | 10/2008 | Forrest et al. .................. 313/504 |
| 2009/0130296 A1 | 5/2009 | Kwong et al. |
| 2009/0278444 A1* | 11/2009 | Forrest et al. .................. 313/504 |
| 2010/0181899 A1* | 7/2010 | Forrest et al. .................. 313/504 |
| 2010/0258821 A1* | 10/2010 | Forrest et al. .................... 257/88 |
| 2011/0045196 A1* | 2/2011 | Forrest et al. ................ 427/427.4 |
| 2011/0174367 A1 | 7/2011 | Hayashi et al. |
| 2011/0215301 A1* | 9/2011 | Forrest ............................. 257/40 |
| 2011/0241046 A1* | 10/2011 | Forrest ............................. 257/98 |
| 2011/0253206 A1 | 10/2011 | Maeda et al. |
| 2012/0001536 A1* | 1/2012 | Zhang et al. .................. 313/504 |
| 2012/0061658 A1* | 3/2012 | Forrest et al. .................... 257/40 |
| 2012/0216866 A1 | 8/2012 | Kato et al. |
| 2013/0019949 A1 | 1/2013 | Wong et al. |
| 2013/0112951 A1 | 5/2013 | Xia et al. |
| 2013/0146850 A1 | 6/2013 | Pieh et al. |
| 2013/0236999 A1 | 9/2013 | Lee et al. |
| 2013/0240840 A1* | 9/2013 | Forrest et al. .................... 257/40 |
| 2013/0240850 A1* | 9/2013 | Forrest et al. .................... 257/40 |
| 2013/0293082 A1* | 11/2013 | Forrest et al. .................... 313/46 |
| 2014/0061594 A1* | 3/2014 | Forrest et al. .................... 257/40 |
| 2014/0127625 A1 | 5/2014 | Defranco et al. |
| 2014/0203244 A1* | 7/2014 | HACK et al. ..................... 257/40 |

OTHER PUBLICATIONS

Chesterfield, R. et al., "Solution-Coating Technology for AMOLED Displays", Frontline Technology, Information Display, Jan. 2011, pp. 24-30.

"Solution-Processed Organic Light-Emitting Diodes Materials", Lumtec—Luminescence Technology Corp., retrieved from http://www.lumtec.com.tw.; 21 pages, (undated).

Chen, G. et al, "Solution-processed organic photovoltaic cells based on a squaraine dye", Phys. Chem, Chem, Phys., 2012, 14:14661-14666.

* cited by examiner

ORGANIC ELECTRONIC DEVICES WITH MULTIPLE SOLUTION-PROCESSED LAYERS

CROSS-REFERENCE TO RELATED APPLICATION

This application claims the benefit under 35 U.S.C. §119 (e) of U.S. Provisional Application Ser. No. 61/871,535, filed Aug. 29, 2013.

GOVERNMENT RIGHTS

This invention was made with Government support from the Department of Energy under contract Nos. DE-SC0000957 and DE-SC0001013, and United States Air Force—Air Force Office of Scientific Research under contract No. FA9550-10-1-0339. The United States Government has certain rights to this invention.

JOINT RESEARCH AGREEMENT

The claimed invention was made by, on behalf of, and/or in connection with one or more of the following parties to a joint university corporation research agreement(s): Regents of the University of Michigan, Princeton University, University of Southern California, Global Photonic Energy Corporation, and/or Universal Display Corporation. The agreement(s) was in effect on and before the date the claimed invention was made, and the claimed invention was made as a result of activities undertaken within the scope of the agreement(s).

FIELD OF THE INVENTION

The present disclosure is related to the field of organic semiconductors, carbon nanotubes, and photoactive devices.

BACKGROUND

In organic electronic devices such as organic photovoltaics (OPVs), organic light emitting devices (OLEDs), and organic solid state lasers it is common to utilize multi-layer structures. While this is typically a simple process for vacuum-processed films, problems arise for solution-processed films. When multi-layer structures are fabricated from solution-processed films, the underlying layers can be re-dissolved, as orthogonal solvents are uncommon.

Here, the inventors present a method of decreasing the re-dissolution of underlying organic layers by incorporating solvent vapor annealing (SVA). The inventors have devised a compound protection layer scheme to allow solution processing of multi-layer organic film structures. The process scheme is useful where orthogonal solvents are not available. The process scheme can be useful for such technologies as fabrication of OPVs and OLEDs as examples.

The inventors have verified the compound protection scheme by fabricating a tandem OPV device structure. The first solution processed layer is coated with a layer, in this case a fullerene, that is insoluble in the solvent used in depositing the second solution processed layer. By SVA the first layer after the deposition of the fullerene, the first solution processed layer becomes densified. Next, a very thin metal oxide layer is deposited completing the compound protection layer of fullerene+metal oxide. Then, on deposition of the second solution processed layer using a solvent (trimethyl-formamine) that is less effective in redissolving the first layer (functionalized squaraines) than its original solvent (chloroform) that have since been SVA, the first layer is undamaged and high performance tandem cells result.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. Where a first layer is described as being "on" or "over" a second layer, there may be intervening layers, unless it is specified that the first layer is "in physical contact with" the second layer.

SUMMARY

According to an embodiment of the present disclosure, a method of fabricating a tandem organic photosensitive device, such as a tandem organic photovoltaic device is provided. The method comprises:

(a) providing a substrate;
(b) depositing a first conductive electrode layer over the substrate;
(c) depositing a first layer of an organic electron donor type material film over the substrate by solution-processing the organic electron donor type dissolved in a first solvent;
(d) depositing a first layer of an organic electron acceptor type material over the first layer of the organic electron donor type material film by a dry deposition process, resulting in an interim stack;
(e) depositing a conductive layer over the interim stack by a dry deposition process;

(f) depositing a second layer of the organic electron donor type film over the conductive layer by solution-processing of the organic electron donor type material dissolved in a second solvent, wherein the organic electron acceptor type material and the conductive layer are insoluble in the second solvent;
(g) depositing a second layer of an organic electron acceptor type material over the second layer of the organic electron donor type material film by a dry deposition process, resulting in a stack; and
(h) depositing a second conductive electrode layer over the stack.

According to an embodiment, the interim stack can be annealed after the step (d) but before the step (e). According to another embodiment, the stack can be annealed after the step (g) but before the step (h). In another embodiment, the method steps recited above can be implemented in reverse order as appropriate to fabricate a tandem OPV in a configuration that is inverted from the one described above.

According to another aspect of the present disclosure, a method for fabricating a tandem OLED is disclosed. The method comprises:
(a) providing a substrate;
(b) depositing a first conductive electrode layer over the substrate;
(c) depositing a first hole injection layer (HIL) by a dry deposition process;
(d) depositing a first hole transport layer (HTL) by a dry deposition process;
(e) depositing a first emissive layer by solution-based process of an emissive material dissolved in a first solvent;
(f) depositing an electron transport layer by a dry deposition process;
(g) depositing a first conductive interlayer by a dry deposition process;
(h) depositing a second HIL by a dry deposition process;
(i) depositing a second HTL by a dry deposition process;
(j) depositing a second emissive layer by solution-based process of the emissive material dissolved in a second solvent, wherein the electron transport layer and the conductive interlayer is insoluble in the second solvent;
(k) depositing a second electron transport layer by a dry deposition process; and
(l) depositing a second conductive interlayer by a dry deposition process. According to an embodiment, the first emissive layer can be annealed after the step (e) but before the step (f). According to another embodiment, the second emissive layer can be annealed after the step (j) but before the step (k).

According to another aspect of the present disclosure, a method for fabricating a multilayered hole injection layer in an OLED is disclosed. The method comprises:
(a) providing a substrate;
(b) depositing a first conductive electrode layer over the substrate;
(c) depositing an organic material as a first hole injection layer over the substrate by a solution-based process;
(d) depositing a layer of $MoO_3$ by a dry deposition process, resulting in a stack; and
(e) depositing the organic material as a second hole injection layer over the $MoO_3$ layer by a solution-based process. After the step (e) the remaining functional layers of the OLED would be completed in order to fabricate a complete OLED. According to an embodiment, the first hole injection layer can be annealed after the step (c) and before the step (d). According to another embodiment, the second hole injection layer can be annealed after the step (e). In another embodiment, the method steps recited above can be implemented in reverse order as appropriate to fabricate a tandem OLED or multilayered HIL in a configuration that is inverted from those recited above.

BRIEF DESCRIPTION OF THE DRAWINGS

The features shown in the above referenced drawings are illustrated schematically and are not intended to be drawn to scale nor are they intended to be shown in precise positional relationship. Like reference numbers indicate like elements.

DETAILED DESCRIPTION

Figure 1:
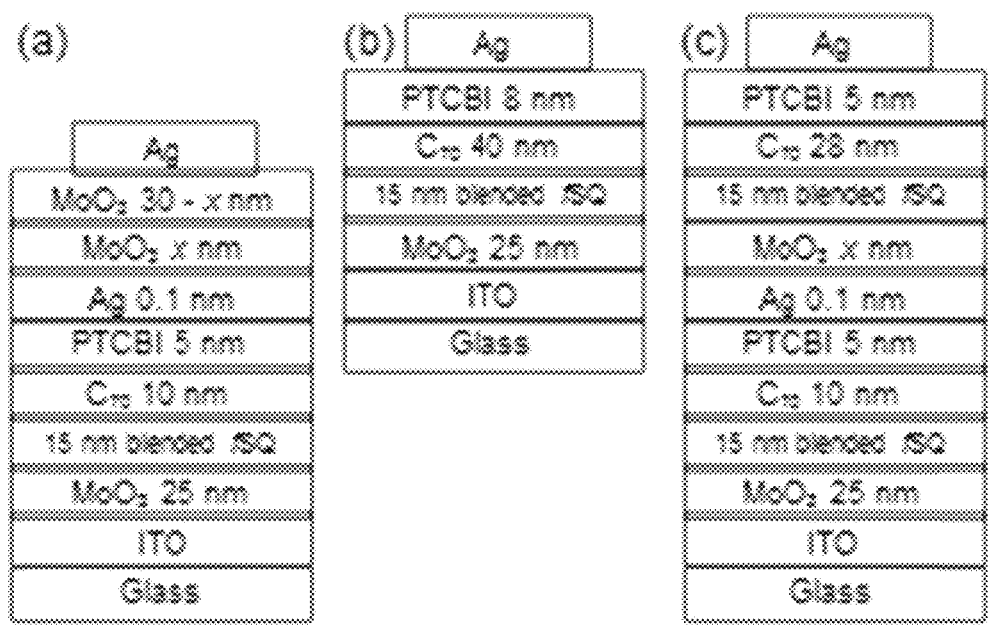
FIGS. 1(a)-1(c) show schematic cross-sectional diagrams of OPV device structures constructed by the inventors (a) Front-only discrete cell, (b) Back-only discrete cell, and (c) Tandem cell, used by the inventors.
FIG. 1(d) shows cross-sectional diagram of an example of an architecture for an organic light emitting device.
FIG. 1(e) shows schematic cross-sectional diagram of an example of an inverted organic light emitting device structure that does not have a separate electron transport layer.
FIG. 1(f) shows cross-sectional diagram of an example of a tandem OLED device.

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

As used herein, the term "organic" includes polymeric materials as well as small molecule organic materials that may be used to fabricate organic opto-electronic devices. "Small molecule" as used herein refers to any organic material that is not a polymer, and "small molecules" may actually be quite large. Small molecules may include repeat units in some circumstances. For example, using a long chain alkyl group as a substitute does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

An organic photosensitive device comprises at least one photoactive region in which light is absorbed to form an exciton, which may subsequently dissociate into an electron and a hole. The photoactive region will typically comprise a donor-acceptor heterojunction, and is a portion of a photosensitive device that absorbs electromagnetic radiation to generate excitons that may dissociate in order to generate an electrical current.

The substrate may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

Referring to FIGS. 1(a)-1(c), schematic diagrams of device structures constructed by the inventors are illustrated. FIG. 1(a) shows a "front-only" discrete cell that was constructed to represent a front cell of a tandem OPV structure. "Front-only" cell refers to the cell in a tandem cell structure that is closer to the anode. FIG. 1(b) shows a "back-only" discrete cell that was constructed to represent a back cell portion of a tandem OPV structure. "Back-only" cell refers to the cell in a tandem cell structure that is closer to the cathode. FIG. 1(c) shows a full tandem cell structure.

Figure 1D:
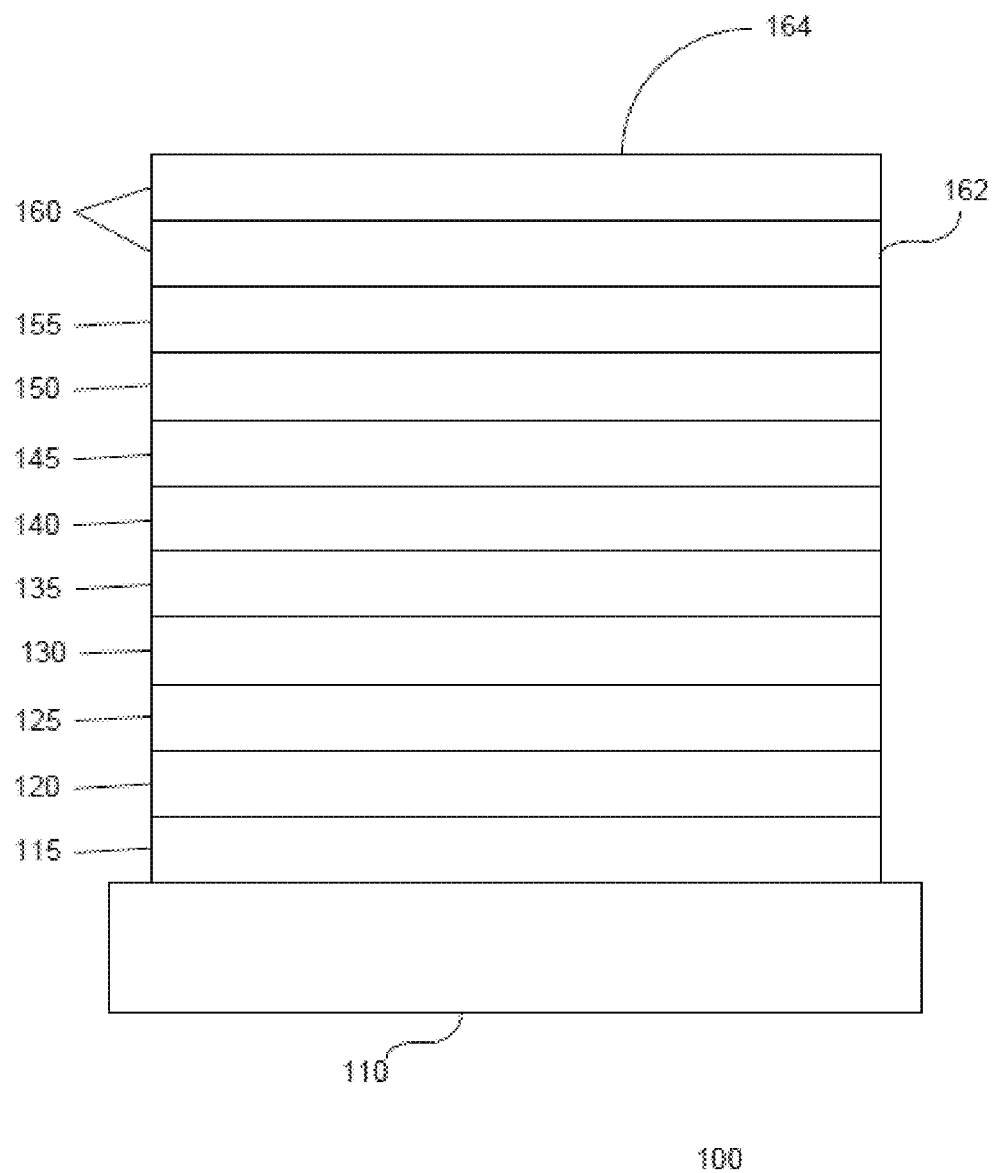

FIG. 1(d) shows an example of an organic light emitting device 100. Device 100 may include a substrate 110, an anode 115, a hole injection layer 120, a hole transport layer 125, an electron blocking layer (optional) 130, an emissive layer 135, a hole blocking layer (optional) 140, an electron transport layer 145, an electron injection layer 150, a protective layer 155, a cathode 160, and a barrier layer 170. Cathode 160 can be a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

Figure 1E:
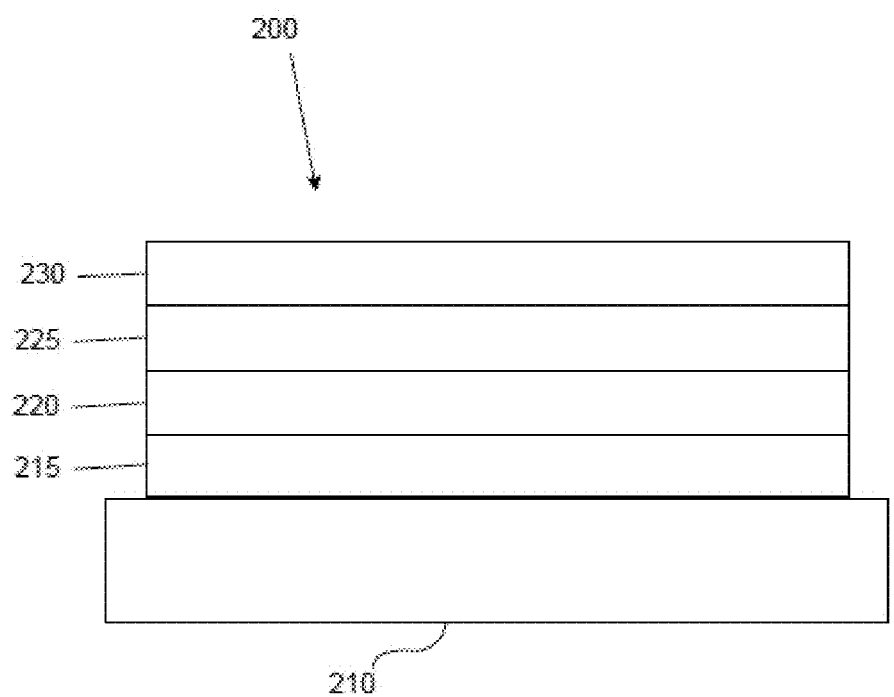
Figure 1F:
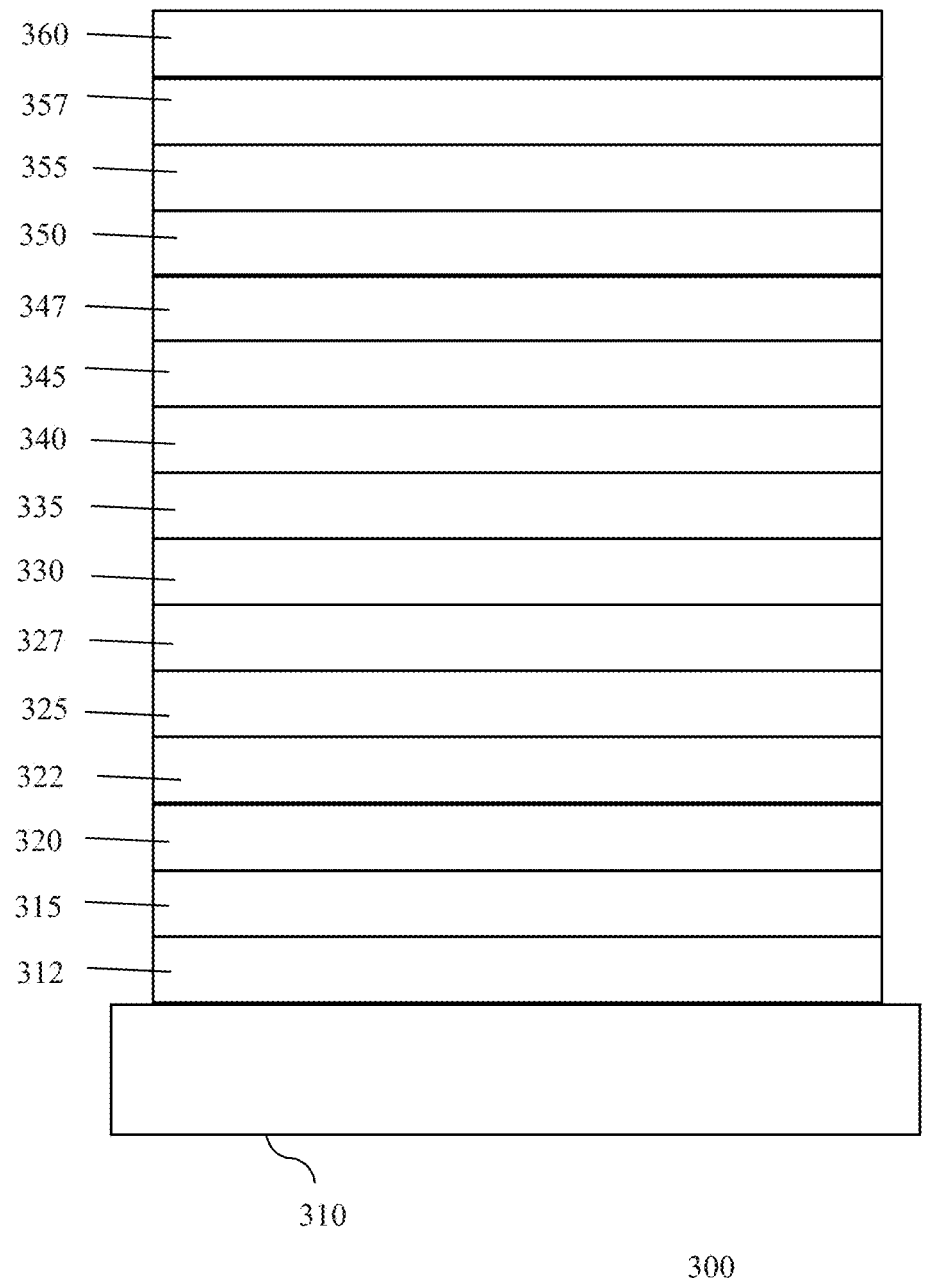

FIG. 1(e) shows an example of an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 1(e) provides one example of how some layers may be omitted from the structure of device 100.

The simple layered structures illustrated in FIGS. 1(a)-1(e) are provided by way of non-limiting examples, and it is understood that embodiments of the invention may be used in connection with a wide variety of other structures for OPVs and OLEDs.

The names given to the various layers in the FIGS. 1(a)-1(e) are not intended to be strictly limiting. For example, in device 200, hole transport layer 225 transports holes and injects holes into emissive layer 220, and may be described as a hole transport layer or a hole injection layer.

The inventors have fabricated a partially solution-processed small molecule tandem organic photovoltaic organic/inorganic interlayer structure example that provides efficient charge recombination while protecting the underlying layers from degradation due to attack from solvents applied during the deposition of subsequent sub-cells. In this example, each sub-cell consists of functionalized squaraine (fSQ) blend as the organic electron donor type material that is cast from solution, followed by evaporation of other functional layers. The first fSQ layer was cast from chloroform, while the second was cast from a tetrahydrofuran, thereby minimizing dissolution of the underlying fullerene layer, the organic electron acceptor type material, that is relatively insoluble in tetrahydrofuran and acts to protect the first donor layer. The organic layers were annealed, by solvent vapor annealing, to increase the sub-cell performance while decreasing the damage caused by spin-coating of the second fSQ layer, both of which result from increased film crystallinity that reduces the rate of solvent penetration. Depending on the particular organic semiconductor materials used, the annealing can be accomplished by solvent vapor annealing or thermal annealing. The tandem cell exhibited a power conversion efficiency of 6.2±0.3% and an open circuit voltage nearly equal to the sum of the constituent sub-cells.

Significant progress in improving the performance of organic photovoltaic (OPV) cells has been made possible through innovations in device architecture, materials, and processing. In particular, the tandem OPV design provides a flexible solution to achieving the highest cell efficiencies, where the open-circuit voltage ($V_{OC}$) can be matched with the incident photon energies by employing one sub-cell that absorbs high energy photons and a second that absorbs at lower energies, thereby decreasing thermalization losses. Tandem OPVs utilizing small molecules have recently been demonstrated with power conversion efficiencies of $\eta_P$=8.3%. Solution-processing is a useful means for fabricating polymer, and possibly small molecule-based tandem OPVs comprised of materials that are incompatible with vacuum deposition. Also, solution processed materials are often compatible with solvent vapor annealing. Solvent vapor annealing has proven effective in increasing the exciton diffusion length and charge collection efficiency.

Disclosed herein is a novel method for solution-processing deposition of multiple layers of organic films that can be applied to expand the tools available for fabricating tandem OLEDs and tandem OPVs. The method allows non-destructive solution deposition of sub-cells in both the lower and upper stacked elements by employing an optically thin organic/inorganic protection layer between the annealed organic elements.

Early tandem OPVs consisted of two small molecule sub-cells separated by a metal-containing interfacial layer that promotes charge recombination. This was followed by demonstration of tandem OPVs consisting of a polymer sub-cell in a stack with a small molecule-based sub-cell, and with two polymer active layers. When both sub-cells consist of solution-processed polymers, the interconnecting layers must provide a barrier to protect the underlying cell from being redissolved when the second sub-cell is deposited. For example, poly(ethylene dioxythiophene)/poly(styrene sulfonic acid) (PEDOT:PSS) has been used because of its insolubility in chlorinated solvents typically employed for the deposition of active-layer materials.

Multiple layers such as $TiO_2$/PEDOT:PSS, ZnO/self-assembled monolayers, and $TiO_2$/Al/$MoO_3$ have also been used to prevent redissolving of the active layers. The drawback of these methods is that the protection layers must be relatively thick (>30 nm) to limit the penetration of solvents through pin-holes or other physical defects in the layer. Thick layers, however, have the disadvantage that they may prevent optimization of the optical field distribution within the cell to maximize the photocurrent. This is possibly a reason that small molecule-based tandem OPVs incorporating solution-processed active materials have not been demonstrated.

Tetrahydrofuran (THF) is an alternative to the ubiquitously used chlorinated solvents, often used in polymer synthesis, and as a solvent for some solution-processed OPVs. The boiling point and viscosity of THF is similar to that of chloroform (CF), with values of 66 and 61° C., and 0.48 and 0.54 cP, respectively. Small molecule materials such as functionalized squaraines (fSQs), have a comparable solubility in THF and CF (~2 mg/ml vs. ~8 mg/ml), allowing for deposition via spin-coating under similar conditions. However, the solubility for fullerenes such as $C_{60}$ and $C_{70}$ is drastically lower in THF (<0.01 mg/ml) than in CF (~0.16 mg/ml). This solubility "contrast" presents an opportunity for fabrication of tandem OPVs with multiple solution-processed small molecule layers. Similar to fullerenes, 3,4,9,10 perylenetetracarboxylic bisbenzimidazole (PTCBI) is also not soluble in THF and its solubility in THF would be similar to that of fullerenes.

According to an embodiment of the present disclosure, a method of fabricating a tandem organic photosensitive device, such as a tandem OPV device is provided. The method comprises: (a) providing a substrate; (b) depositing a first conductive electrode layer over the substrate; (c) depositing a first layer of an organic electron donor type material over the substrate by solution-processing the organic electron donor type material dissolved in a first solvent; (d) depositing a first layer of an organic electron acceptor type material over the first layer of the organic electron donor type material film by a dry deposition process, resulting in an interim stack; (e) depositing a conductive layer over the interim stack by a dry deposition process; (f) depositing a second layer of the organic electron donor type material over the conductive layer by solution-processing of the organic electron donor type material dissolved in a second solvent, wherein the organic electron acceptor type material and the conductive layer are insoluble in the second solvent; (g) depositing a second layer of an organic electron acceptor type material over the second layer of the organic electron donor type material by a dry deposition process, resulting in a stack; and (h) depositing a second conductive electrode layer over the stack.

According to an embodiment, the interim stack can be optionally annealed after the step (d) but before the step (e). According to another embodiment, the stack can be optionally annealed after the step (g) but before the step (h).

In one embodiment, the organic electron donor type material is a small molecule material, functionalized squaraine (fSQ), the organic electron acceptor type material is a small molecule material, fullerene, the first solvent is chloroform or tetrahydrofuran, and the second solvent is tetrahydrofuran.

In one embodiment, the OPV embodiment of the method described above further comprises a step of annealing the interim stack before depositing the conductive layer over the interim stack. The method can further comprise a step of annealing the stack before depositing the second conductive electrode layer over the stack. The annealing can be solvent vapor annealing or thermal annealing.

The dry deposition process as referenced herein includes vacuum-processing such as vacuum thermal evaporation (VTE) and organic vapor phase deposition (OVPD), and other dry deposition process such as lamination.

In one embodiment, the dry deposition process is VTE process. The first conductive electrode layer is an anode and the second conductive electrode layer is a cathode. The conductive layer between the first cell and the second cell is a charge transport layer. The conductive layer can be formed from PTCBI.

In an example described below, we incorporate two solution- and vapor-processed, blended-fSQ sub-cells into a tandem OPV. One sub-cell consists of a blended-fSQ as the organic electron donor type material that is cast from a CF solution, followed by VTE of the fullerene as the organic electron acceptor type material and a conductive electron transport material layer of PTCBI. Next, a charge recombination layer consisting of a thin layer of Ag and $MoO_3$ is deposited by VTE before the second sub-cell layers are deposited. Charge recombination happens between the Ag and the $MoO_3$. The second sub-cell, also based on fSQs as the organic electron donor type material, is then deposited by solution-based process from a THF solution, thereby minimizing dissolution of the underlying fullerene, $C_{60}$, layer and the charge transport material (PCTBI) which are relatively insoluble in THF. The $C_{60}$ and PTCBI layers protect the blended fSQ donor layer.

Furthermore, annealing, by solvent vapor annealing (SVA) in this example, of the first sub-cell stack is found to simultaneously increase the sub-cell performance while decreasing any damage that can be caused by the solution-based processing of the second fSQ layer, both of which are due to the increased crystallinity in the film that reduces solvent penetration. The resulting tandem cell has a power conversion efficiency of $\eta_P$=6.2±0.3%, and an open circuit voltage of $V_{OC}$=1.78±0.01 V, or nearly equal to the sum of the constituent sub-cells. Thus, annealing of the first sub-cell stack can be optionally implemented in the method of the present disclosure. For the electron donor type material and electron acceptor type material set of fSQ and fullerene, respectively, the first solvent can be chloroform or THF and the second solvent can be THF and the annealing by SVA consists of exposure to a dichloromethane vapor for about 5 to 10 minutes.

The methods described herein for the tandem OPV embodiment can be implemented to fabricate tandem OPVs in the inverted configuration with respect to the configurations described above. In the inverted configuration embodiment, the process steps described above would be implemented in the reverse order to fabricate the inverted configuration which would be readily understood by one of ordinary skill in the art.

As defined and used herein, organic electron donor type materials and the organic electron acceptor type materials include small molecule materials as well as polymers. In addition to fSQ, other suitable organic electron donor type materials include, but are not limited to, BTEM-PPV (Poly (2,5-bis(1,4,7,10-tetraoxaundecyl)-1,4-phenylenevinylene), Poly(3-decyloxythiophene), CuPc (copper phthalocyanine), NPD (4,4'-bis(N-(1-napthyl)phenylamino)biphenyl), pentacene, and tetracene. In addition to the fullerene disclosed herein, other suitable organic electron acceptor type materials include, but are not limited to, PCBM ([6,6]-Phenyl $C_{84}$ butyric acid methyl ester), $F_{16}$—CuPc, PTCBI (3,4,9,10 perylenetetracarboxylic bisbenzimidazole), PTCDA (3,4,9, 10 perylene-tetracarboxylic dianhydride), or Poly(benzimidazobenzo phenanthroline), TCNQ (7,7,8,8-tetracyanoquinodimethane), and F4-TCNQ (tetrafluorotetracyanoquinodimethane).

As used herein, "solution-processing", "solution-based process", "solution-based deposition" refer to solution-based deposition processes in which a material is deposited from a liquid medium, either in solution or suspension form. Such methods are often used in the fabrication process of OPVs and OLEDs and are well known to those skilled in the art. Such solution-based processes include, but are not limited to, blade-coating, slot-die coating, ink-jet printing, screen printing, gravure printing, spin-coating, etc.

The disclosed method can be applied to fabrication of tandem OLED devices. For example, two or more OLED sub-cells can be stacked on top of each other, similar to the tandem OPV discussed above. The structure of such tandem OLED device 300 is shown in FIG. 1(*f*). The tandem OLED can be fabricated by (a) providing a substrate 310; (b) depositing a first conductive electrode layer 312 over the substrate; (c) depositing a first hole injection layer (HIL) 315 by a dry deposition process; (d) depositing a first hole transport layer (HTL) 320 by a dry deposition process; (e) depositing a first emissive layer (EML) 325 by solution-based process of an emissive material dissolved in a first solvent; (f) depositing an electron transport layer (ETL) 330 by a dry deposition process; (g) depositing a first conductive interlayer 335 by a dry deposition process; (h) depositing a second HIL 340 by a dry deposition process, (i) depositing a second HTL 345 by a dry deposition process; (j) depositing a second EML 350 by solution-based process of the emissive material dissolved in a second solvent, wherein the ETL and the conductive interlayer is insoluble in the second solvent; (k) depositing a second ETL 355 by a dry deposition process; and (l) depositing a second conductive interlayer by 360 a dry deposition process. According to an embodiment, the first emissive layer can be annealed after the step (e) but before the step (f). According to another embodiment, the second emissive layer can be annealed after the step (j) but before the step (k). As mentioned above, the annealing can be solvent vapor annealing or thermal annealing depending on the particular organic materials involved.

In the tandem OLED 300, one or more of the following optional dry deposition processed layers can also be included at the location indicated in FIG. 1(*f*): electron blocking layers (EBL) 322, 347, hole blocking layers (HBL) 327, 357. Such tandem OLED can be fabricated with appropriate emissive materials for the EML layer so that the two EMLs emit same color light (e.g. green+green, blue+blue, etc.) or white light (e.g. orange+blue or red+green+blue). Tandem OLEDs can be beneficial by increasing the life time of the OLED at a given power output or increasing the power output of the OLED at a given life time.

In one embodiment, the second solvent is THF and the previously a dry deposition processed layers are insoluble in THF.

Another example is to produce a multilayered organic hole injection layer (HIL) in an OLED device using a solution-based deposition process. Such multilayered organic HIL can have the following structure: a first organic HIL layer/$MoO_3$ layer/a second organic HIL layer. The first organic HIL layer would be deposited by a solution-based process. The $MoO_3$ layer is then deposited over the first organic HIL layer by an evaporation process (e.g. VTE). Next, the second organic HIL layer is deposited by a solution-based process. Since the intervening $MoO_3$ layer is insoluble in any organic solvents, it protects the first solution-processed organic HIL layer during the deposition of the second organic HIL by solution-based deposition process. Optionally, the first organic HIL layer can be annealed before the dry deposition processing of the $MoO_3$ layer. Further optionally, the second organic HIL layer also can be annealed. The annealing can be solvent vapor anneal or thermal anneal.

As with the tandem OPV embodiment, the tandem OLED embodiment and the multilayered HIL embodiments can be fabricated in inverted configuration with respect to the configuration described above. In the inverted configuration, the process steps described herein are implemented in the reverse order which would be readily understood by one of ordinary skill in the art.

An example of organic material for the organic HIL layer is poly(3,4-ethylenedioxythiophene) Polystyrene sulfonate PEDOT:PSS that can be used with water or propanediol as solvents. Another example of organic material for forming the organic HIL layer is a solution prepared by mixing one of the triarylamine derivatives such as Compounds 1, 2, and 3, shown below, with a conductivity dopant such as Dopant 1, shown below, using cyclohexanone as the solvent.

Compound 1

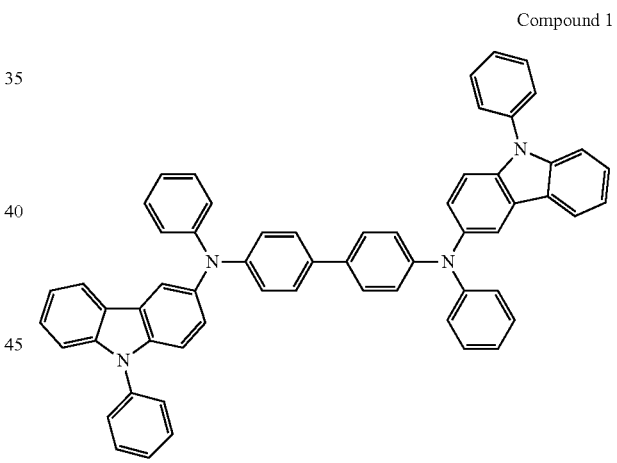

Compound 2

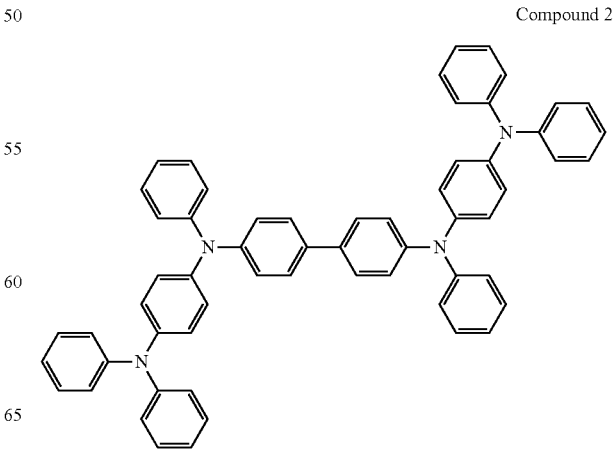

-continued

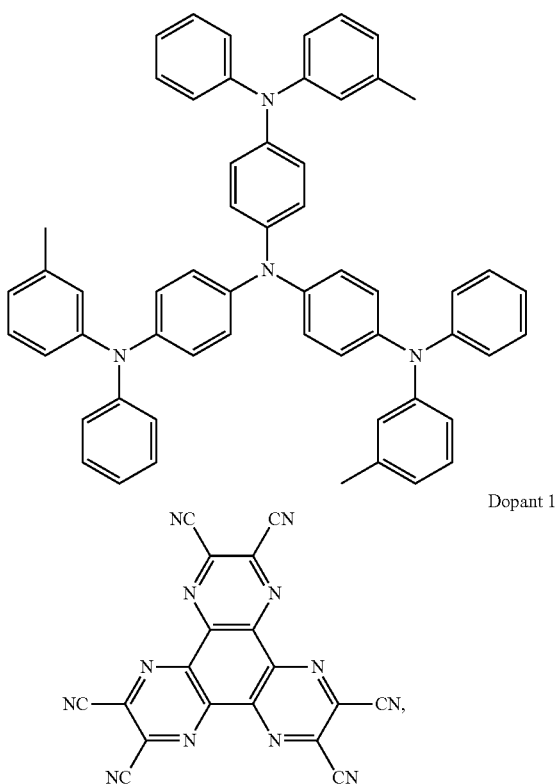

Compound 3

Dopant 1

EXPERIMENTAL

The novel method disclosed herein has been verified by fabricating samples of OPV devices. The devices were grown on glass substrates pre-coated with 130 nm-thick layer of indium tin oxide (ITO) with a sheet resistance of 15Ω/□. Prior to deposition of the sub-cell structures, the ITO surface was cleaned in a surfactant and a series of solvents, and then exposed to ultraviolet-ozone for 10 minutes prior to loading into a high vacuum chamber (base pressure<$10^{-7}$ Torr) where $MoO_3$ protection layer was deposited by vacuum thermal evaporation (VTE) at ~0.1 nm/s. Substrates were subsequently transferred into a high-purity $N_2$-filled glovebox, where 15 nm-thick blended squaraine films were spin-coated at 3000 rpm from 1.9 mg/ml solutions of 4:6 volume ratio of [2-[4-(N,N-diphenylamino)-2,6-dihydroxyphenyl]-4-[4-diphenyliminio]squaraine] (DPASQ), and 2,4-bis[4-(N,N-diphenylamino)-2,6-dihydroxyphenyl]squaraine (DPSQ) dissolved in CF or THF (used for processing the "front" sub-cell adjacent to the anode, or the "back" sub-cell adjacent to the cathode, respectively) and filtered through anodic alumina membranes with a 20 nm pore size.

Substrates were returned to the high vacuum chamber in an ultrahigh purity $N_2$ environment for VTE deposition of train-sublimation-purified $C_{70}$ and a 3,4,9,10 perylenetetracarboxylic bisbenzimidazole (PTCBI) electron transporting layer at a rate of 0.1 nm/s. Some samples were transferred back into the glovebox for SVA consisting of exposure to a saturated dichloromethane vapor for a predetermined duration to create the desired nanocrystalline film morphology. For the specific material set and the film thicknesses practiced here, the exposure to a saturated dichloromethane vapor was optimized at 7.5 minutes. Generally, SVA can be from 1 minute to 60 minute exposure in a solvent vapor depending on the materials involved. SVA is well-known to one of ordinary skill in the art and one would readily understand how to implement a particular SVA condition for a given set of materials involved.

Next, the transparent charge-recombination layer consisting of a thin Ag nanoparticle layer (average thickness of 0.1 nm) and $MoO_3$ was deposited by VTE. For the back sub-cell, an identical blend of squaraines dissolved in THF was spin-cast under similar conditions, followed by evaporation of $C_{60}$ and PTCBI and SVA. The device was completed by evaporating the 100 nm-thick Ag cathode at 0.1 nm/s through a shadow mask with an array of 1 mm diameter openings. Layer thicknesses were measured using quartz crystal monitors during deposition, and ex situ by variable-angle spectroscopic ellipsometry.

Current density-vs.-voltage (J-V) characteristics of the tandem OPV sub-cells were measured in an ultra-pure $N_2$ ambient in the dark and under simulated AM1.5 G solar illumination from a filtered 300 W Xe lamp whose intensity was varied using neutral density filters. The incident light intensity of 70 mW/cm$^2$ was measured using an NREL-traceable Si detector. The efficiency is found to be nearly constant from 20 mW/cm$^2$ up to approximately 1 sun intensity. Short-circuit current densities ($J_{SC}$) of discrete OPVs were corrected for spectral mismatch. Spectrally resolved external quantum efficiencies (EQE) were measured using monochromated light from a 150 W Xe arc-lamp using optics that under-filled the device area; optical power was calibrated with a NIST-traceable Si detector. Integration of the EQE convoluted with the solar spectrum resulted in values within ±10% of the corrected $J_{SC}$ for the single-cell devices. Errors quoted correspond to the deviation from the average value of three or more devices on the same substrate.

The tandem sub-cell J-V characteristics and EQE were modeled considering the optical field distribution within the layers, exciton diffusion, and light-intensity-dependent J-V characteristics taken from single-cell devices. The spectral mismatch factor (M) for the tandem cell was calculated by dividing the power conversion efficiency calculated using the lamp spectrum and that calculated using the standard solar spectrum.

Figure 2:
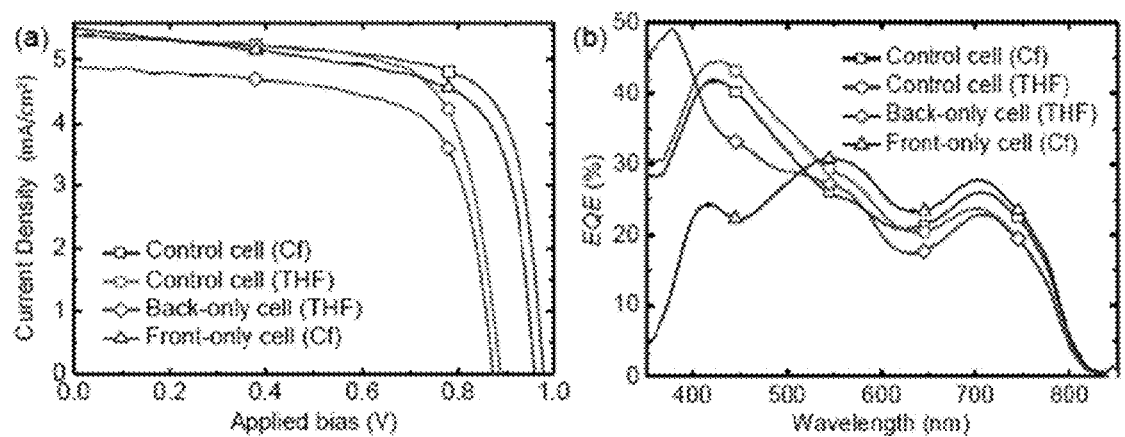
FIG. 2(a) shows current density vs. voltage (J-V) characteristics in under 70 $mW/cm^2$, simulated AM1.5G illumination for a blended functionalized squaraine/$C_{60}$ organic solar cell using a chloroform (CF) solvent (square), and a similar cell using tetrahydrofuran (THF) solvent (circle), a cell using THF (diamond) for positioning near the cathode of the tandem (back-only cell), and a cell for positioning near the transparent anode (front-only cell) using CF (triangle).
FIG. 2(b) shows external quantum efficiencies (EQEs) for the cells in FIG. 2(a).

In order to separately characterize the sub-cell performances, the individual cells were fabricated and tested with the following structure: glass/ITO/25 nm $MoO_3$/15 nm blended $f$SQ/40 nm $C_{60}$/8 nm PTCBI/100 nm Ag, where the blend was dissolved in either CF or THF, and then annealed by solvent vapor annealing after deposition of the PTCBI buffer layer. The SVA consisted of exposure to a saturated dichloromethane vapor for 7.5 minutes. The J-V characteristics under illumination, and the EQE spectra are shown in FIG. 2, with device performance parameters summarized in Table I. The CF-solubilized cell had $V_{OC}$=0.96±0.01 V, fill factor (FF)=73±1%, responsivity (R)=7.7±0.3×$10^{-2}$ A/W, and $\eta_P$=5.5±0.2%, which is within experimental error of previously reported results for analogous devices. The THF-based cell had $V_{OC}$=0.89±0.02 V, FF=71±1%, R=7.7±0.3×$10^{-2}$ A/W, and $\eta_P$=4.9±0.2%. The decrease in $V_{OC}$ compared to the CF-based cell is likely due to a difference in phase segregation between the two $f$SQ molecules, leading to increased recombination at the donor-acceptor junction.

To simulate the damage to the underlying layers caused by the spin-coating of a second solution-based material onto its surface, we investigated the effects of spinning THF on the top of the following multi-layer film structure: glass/ITO/25 nm $MoO_3$/15 nm blended $f$SQ (spun on using CF)/10 nm $C_{70}$/5 nm PTCBI/0.1 nm Ag/x $MoO_3$, where x=5 or 20 nm. The optical micrograph FIG. 3(a) and the atomic force micrograph FIG. 3(b) correspond to the case of a solvent vapor annealed sample with x=5 nm. The multi-layer film structure was not exposed to THF, resulting in a film that appears featureless under microscopic examination. The surface morphology of the film is similar to that of the ITO, with a root-mean-square (RMS) roughness of 1.5 nm. The optical micrograph FIG. 3(c) and the atomic force micrograph 3(d) show as-cast film with x=5 nm where THF was spun on the top of the same structure. The film significantly roughen to a RMS=4.9 nm due to re-dissolution of the underlying ƒSQ layers. In the optical micrograph FIG. 3(e) and the atomic force micrograph 3(f), the multi-layer film structure for an x=5 nm sample was solvent vapor annealed after the PTCBI layer is deposited, followed by spinning of THF onto the surface. The film contains ~1 µm-diameter by 10 nm-high protrusions covering ~10% of its surface, suggesting that solvent has penetrated into the underlying layers resulting in swelling. Outside the damaged area exhibited RMS=1.5 nm, similar to the unexposed case. As the $MoO_3$ thickness is increased, the density of these protrusions decreases and are nearly eliminated for x=20 nm (FIGS. 3(g) and 3(h)).

Figure 3:
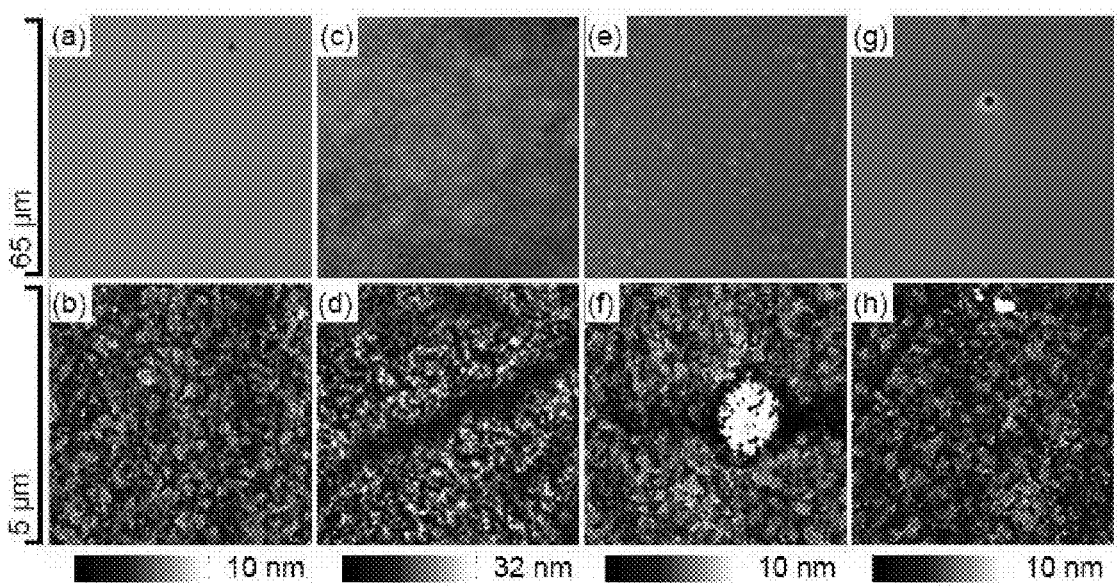
FIG. 3 shows optical (top row) and atomic force (bottom row) micrographs for samples having undergone different processing procedures: (a, b) solvent-vapor annealed (SVA), no THF exposure; (c, d) as-cast, 5 nm $MoO_3$ layer, THF exposure; (e, f) SVA, 5 nm $MoO_3$ layer, THF exposure; (g, h) SVA, 20 nm $MoO_3$ layer, THF exposure. The vertical scales for the bottom row of micrographs are indicated below each image.

Re-dissolution caused by the deposition of the second solution-processed layer can be minimized in two ways. First, as shown in FIG. 3, SVA decreases the radius of the defects caused by the exposure to the second THF solution. The roughness of the sample in FIG. 3(f) is the same as that of the unexposed film in FIG. 3(b), indicating that solvent penetrates only through pinholes. The SVA increases the density of the donor and acceptor layers as they reorganize and crystallize, filling in some of the voids in the as-cast film. This limits the area of exposure to solvent penetration that otherwise results in significant local roughening (see FIG. 3(c)).

Figure 4:
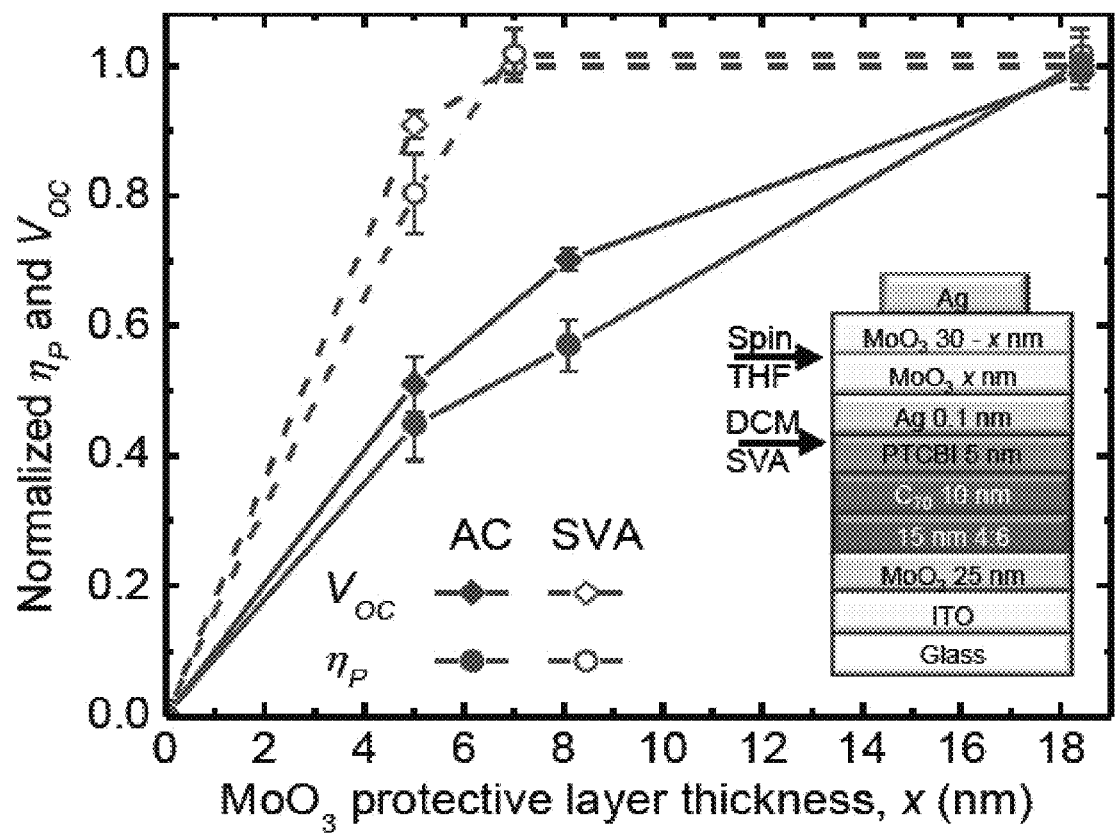
FIG. 4 shows power conversion efficiencies ($\eta_P$, circles) and open-circuit voltages ($V_{OC}$, diamonds) for front-only single cells exposed to THF as a function of the $MoO_3$ layer thickness, normalized to values for cells unexposed to THF. As-cast cell data are indicated by closed symbols, while solvent-vapor-annealed (SVA) cells are indicated by open symbols.

Additionally, the damage from applying the second solution-processed layer can be further decreased by increasing the $MoO_3$ protection layer thickness. The plot in FIG. 4 shows that, for the case of as-cast films exposed to THF, ~20 nm of $MoO_3$ is necessary to achieve the same performance as cells unexposed to the solution. By combining both approaches—a SVA-processed device with a $MoO_3$ protection layer of 7 nm—the same power conversion efficiency is achieved as an analogous device that has not been exposed to THF. The thin $MoO_3$ layer allows for the optimal placement of the cells in the optical field, thereby resulting in a high $J_{SC}$.

We fabricated a series of devices to simulate the behavior of the front sub-cell (i.e. that positioned closest to the ITO anode in the tandem) using the following structure: glass/ITO/25 nm $MoO_3$/15 nm blended ƒSQ (CF)/10 nm $C_{70}$/5 nm PTCBI/0.1 nm Ag/x nm $MoO_3$/30-x nm $MoO_3$/100 nm Ag. These cells were fabricated by vacuum depositing the $MoO_3$ layer on ITO, spinning on the blended ƒSQ, and the vacuum depositing both the $C_{70}$, and PTCBI layers. Some films were subsequently solvent vapor annealed. The second $MoO_3$ layer was then deposited (with x=0 to 18 nm) and exposed to spin cast THF, thereby simulating the effects of the deposition of a second blended ƒSQ layer. The devices were completed by depositing the final layer of $MoO_3$ and Ag, keeping the total amount of $MoO_3$ constant for all samples.

FIG. 4 shows a plot of $V_{OC}$ (diamonds) and $\eta_P$ (circles) for as-cast (AC, filled points) and SVA (open points) cells as functions of x, where both parameters are normalized to their values for similar cells unexposed to THF. For both AC and SVA cells, x=0 (i.e. no $MoO_3$ protection layer) leads to device shorts. As x increases, $V_{OC}$ and $\eta_P$ increase monotonically. The AC cell performance is similar to that of the unexposed cell at x=18 nm, while the SVA cell requires only x=7 nm. This is consistent with the images in FIG. 3, where there is substantially more damage to the AC films compared to the SVA films at x=5 nm.

We also fabricated a tandem cell using the optimized $MoO_3$ protection layer thicknesses coupled with solvent vapor annealing of the lower sub-cell. The discrete cell with a design optimized for the position nearest to the anode (i.e. a front-only cell) had the same structure as above with x=7 nm, while the cathode-optimized (back-only) cell has the structure: glass/ITO/25 nm $MoO_3$/15 nm blended ƒSQ (dissolved in THF)/28 nm $C_{60}$/5 nm PTCBI/100 nm Ag, layer. The front-only and back-only J-V and EQE data are shown in FIG. 2 and summarized in Table I below. The tandem cell structure using these sub-cells is: glass/ITO/25 nm $MoO_3$/15 nm blended ƒSQ (CF)/10 nm $C_{70}$/5 nm PTCBI/0.1 nm Ag/7 nm $MoO_3$/15 nm blended ƒSQ (THF)/28 nm $C_{60}$/5 nm PTCBI/100 nm Ag, with the layers solvent annealed after deposition of each PTCBI layer. The optimized tandem cell had $V_{OC}$=1.78±0.01 V, FF=67±1%, R=4.9±0.02×$10^{-2}$ A/W, and $\eta_P$=6.2±0.3%, (with a spectral mismatch factor M of 0.95±0.01).

Figure 5:
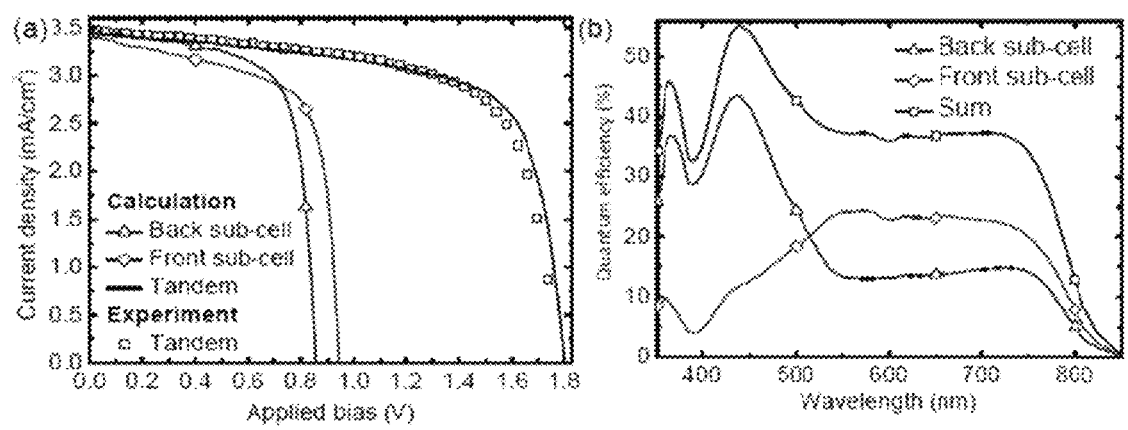
FIG. 5(a) shows current density vs. voltage (J-V) characteristics in the $4^{th}$ quadrant under 70 $mW/cm^2$, simulated AM1.5G illumination for the optimized tandem cell (squares), along with the calculated J-V characteristics for the tandem (line), back-only sub-cell (triangle), and front-only sub-cell (diamond).
FIG. 5(b) shows quantum efficiency calculations for the back-only sub-cell (triangle) and front-only sub-cell (diamond). The calculated sum of these two curves (square) represents the total photon harvesting efficiency for the tandem cell.

The experimental and calculated J-V characteristics shown in FIG. 5 are in agreement, indicating the absence of significant damage to the front sub-cell due to either the deposition of the second blended ƒSQ layer, or from subsequent SVA. The EQEs of each sub-cell shown in FIG. 5(b) show less curvature at λ=650 nm than for the single-cell in FIG. 2(b). This results since >90% of the photons are absorbed between 550 nm<λ<720 nm in the blended 30 nm thick (total) ƒSQ layers. While the total quantum efficiency of the tandem cell is limited due to significant spectral overlap between the active materials in the front and back sub-cells, there is nevertheless a >25% increase compared to the optimized discrete cell. The FF of the tandem is similar to that of the discrete devices, and the tandem $V_{OC}$=1.78±0.01 V is nearly equal to the sum of the respective discrete cells of $V_{OC}$=1.84±0.02 V, indicating that there is efficient charge transport and recombination in the interlayer between the sub-cells. Overall, $\eta_P$ for the tandem is 12% higher than that of the optimized discrete cells.

TABLE I

Organic photovoltaic performance under 70 mW/$cm^2$ simulated AM1.5G illumination, corrected for spectral mismatch.

| Device | Data | Solvent | $V_{OC}$ (V)[a] | FF (%)[b] | R ($10^{-2}$ A/W)[c] | $\eta_P$ (%) | M[a] |
|---|---|---|---|---|---|---|---|
| Control | Exp. | CF | 0.96 | 73 | 7.7 | 5.5 ± 0.2 | 0.98 |
| Control | Exp. | THF | 0.89 | 71 | 7.7 | 4.9 ± 0.2 | 0.98 |
| Back-only | Exp. | THF | 0.88 | 69 | 7.0 | 4.2 ± 0.2 | 1.00 |
| Front-only | Exp. | CF | 0.96 | 67 | 7.8 | 5.0 ± 0.2 | 0.96 |
| Back sub-cell | Calc. | THF | 0.86 | 70 | 5.0 | 3.0 | 0.98 |
| Front sub-cell | Calc. | CF | 0.94 | 69 | 5.2 | 3.4 | 0.92 |
| Tandem | Calc. | Both | 1.80 | 70 | 5.1 | 6.4 | 0.95 |
| Tandem | Exp. | Both | 1.78 | 67 | 4.9 | 6.2 ± 0.3 | 0.95 |

Experimental errors:
[a]±0.01,
[b]±1,
[c]±0.3.

In summary, the inventors have demonstrated a small molecule tandem OPV consisting of two solution- and vapor-processed, blended functionalized-squaraine/fullerene sub-cells separated by a thin and insoluble $MoO_3$/$C_{60}$ protective interlayer. The relatively low solubility of fullerenes in THF minimizes penetration of the solvent into the underlying blended ƒSQ donor layer, thereby minimizing layer dissolution and damage. Damage was further reduced by solvent vapor annealing of the front sub-cell, where the increased crystallinity of the blended-ƒSQ layer simultaneously improved the sub-cell performance and reduced the damage associated with solvent penetrating the previously deposited layers. The resulting tandem cell has a power conversion efficiency of $\eta_P$=6.2±0.3% and an open circuit voltage of $V_{OC}$=1.78±0.01 V, or nearly the sum of the constituent sub-cells.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method of fabricating a tandem organic photosensitive device, the method comprising:
    providing a substrate;
    depositing a first conductive electrode layer over the substrate;
    depositing a first layer of an electron donor type small molecule material film over the substrate by solution-processing of the electron donor type small molecule material dissolved in a first solvent;
    depositing a first layer of an electron acceptor type small molecule material over the first layer of the electron donor type small molecule material film by a dry deposition process, resulting in an interim stack;
    depositing a conductive layer over the interim stack by a dry deposition process;
    depositing a second layer of the electron donor type small molecule material film over the conductive layer by solution-processing of the electron donor type small molecule material dissolved in a second solvent, wherein the electron acceptor type small molecule material and the conductive layer are insoluble in the second solvent;
    depositing a second layer of an electron acceptor type small molecule material over the second layer of the electron donor type small molecule material film by a dry deposition process, resulting in a stack; and
    depositing a second conductive electrode layer over the stack.

2. The method of claim 1, wherein the electron donor type small molecule material is functionalized squaraine, the electron acceptor type small molecule material is fullerene, the first solvent is chloroform or tetrahydrofuran, and the second solvent is tetrahydrofuran.

3. The method of claim 1, further comprising a step of annealing the interim stack before depositing the conductive layer over the interim stack.

4. The method of claim 3, wherein the annealing step is solvent vapor annealing or thermal annealing.

5. The method of claim 3, further comprising a step of annealing the stack before depositing the second conductive electrode layer over the stack.

6. The method of claim 5, wherein the annealing steps are solvent vapor annealing or thermal annealing.

7. The method of claim 4, wherein the solvent vapor annealing consisting of exposure to a dichloromethane vapor for 5 to 10 minutes.

8. The method of claim 6, wherein the solvent vapor annealing consisting of exposure to a dichloromethane vapor for 5 to 10 minutes.

9. The method of claim 1, wherein the a dry deposition process is vacuum thermal evaporation process.

10. The method of claim 9, wherein the first conductive electrode layer is an anode and the second conductive electrode layer is a cathode.

11. The method of claim 9, wherein the conductive layer between the interim stack and the second layer of the electron donor type material film comprises a thin layer of Ag and $MoO_3$.

12. The method of claim 11, wherein the $MoO_3$ layer has a thickness between 5-20 nm.

13. The method of claim 9, wherein the conductive layer is formed from PTCBI.

14. A method for fabricating a tandem organic light emitting device, the method comprising:
    (a) providing a substrate;
    (b) depositing a first conductive electrode layer over the substrate;
    (c) depositing a first hole injection layer by a dry deposition process;
    (d) depositing a first hole transport layer by a dry deposition process;
    (e) depositing a first emissive layer by solution-based process of an emissive material dissolved in a first solvent;
    (f) depositing an electron transport layer by a dry deposition process;
    (g) depositing a first conductive interlayer by a dry deposition process;
    (h) depositing a second HIL by a dry deposition process;
    (i) depositing a second HTL by a dry deposition process;
    (j) depositing a second emissive layer by solution-based process of the emissive material dissolved in a second solvent, wherein the electron transport layer and the conductive interlayer is insoluble in the second solvent;
    (k) depositing a second electron transport layer by a dry deposition process; and
    (l) depositing a second conductive interlayer by a dry deposition process.

15. The method of claim 14, further comprising an annealing step after step (e) but before step (f).

16. The method of claim 15, wherein the annealing step is solvent vapor annealing or thermal annealing.

17. The method of claim 14, further comprising a second annealing step after step (j) but before step (k).

18. The method of claim 17, wherein the annealing steps are solvent vapor annealing or thermal annealing.

19. The method of claim 14, wherein an optional electron blocking layer is deposited by a dry deposition process after step (d) but before step (e).

20. The method of claim 14, wherein an optional hole blocking layer is deposited by a dry deposition process after step (f) and before step (g).

21. The method of claim 14, wherein an optional electron blocking layer is deposited by a dry deposition process after step (h) and before step (i).

22. A method for fabricating a multilayered hole injection layer in an organic light emitting device, the method comprising:
    providing a substrate;
    depositing a first conductive electrode layer over the substrate;
    depositing an organic material as a first hole injection layer over the substrate by a solution-based process;
    depositing a layer of $MoO_3$ by a dry deposition process, resulting in a stack; and
    depositing the organic material as a second hole injection layer over the $MoO_3$ layer by a solution-based process.

23. The method of claim 22, further comprising an annealing step after depositing the first hole injection layer but before depositing the MoO$_3$ layer.

24. The method of claim 23, wherein the annealing step is solvent vapor annealing or thermal annealing.

25. The method of claim 23, further comprising a second annealing step after depositing the second hole injection layer.

26. The method of claim 23, wherein the annealing steps are solvent vapor annealing or thermal annealing.

27. The method of claim 22, wherein the a dry deposition process is vacuum thermal evaporation process.

* * * * *